United States Patent [19]

Posner et al.

[11] Patent Number: 5,249,201
[45] Date of Patent: Sep. 28, 1993

[54] TRANSMISSION OF MULTIPLE CARRIER SIGNALS IN A NONLINEAR SYSTEM

[75] Inventors: Richard Posner, Woodland Hills; Zvi Regev, West Hills, both of Calif.

[73] Assignee: MST, Inc., Westlake Village, Calif.

[21] Appl. No.: 649,857

[22] Filed: Feb. 1, 1991

[51] Int. Cl.$^5$ .................................. H04L 27/04
[52] U.S. Cl. ...................... 375/59; 359/184; 332/106
[58] Field of Search .............. 375/59, 60; 330/10, 330/124 R; 455/341; 332/149, 106, 107; 359/184, 180

[56] References Cited

U.S. PATENT DOCUMENTS

| | | | |
|---|---|---|---|
| 1,874,159 | 8/1932 | Bedford | 330/10 |
| 2,900,459 | 8/1959 | Olive | 330/10 |
| 3,002,161 | 9/1961 | Feryszka | 330/124 R |
| 3,229,209 | 1/1966 | Critchlow et al. | 455/341 |
| 3,319,175 | 5/1967 | Dryden | 330/20 |
| 3,652,947 | 3/1972 | Hollingsworth | 330/295 |
| 3,777,275 | 12/1973 | Cox | 330/10 |
| 3,927,379 | 12/1975 | Cox et al. | 330/10 |
| 4,092,610 | 5/1978 | White et al. | 330/10 |
| 4,164,714 | 8/1979 | Swanson | 330/10 |
| 4,178,557 | 12/1979 | Henry | 330/124 R |
| 4,186,346 | 1/1980 | Wysocki | 455/108 |
| 4,205,241 | 5/1980 | Fish et al. | 330/10 |
| 4,403,197 | 9/1983 | Swanson | 330/10 |
| 4,417,358 | 11/1983 | Zeis | 455/109 |
| 4,449,103 | 5/1984 | Kyrian | 330/123 |
| 4,524,335 | 6/1985 | Yokoyama | 330/10 |
| 4,560,944 | 12/1985 | Furrer | 330/10 |
| 4,646,359 | 2/1987 | Furrer | 455/108 |
| 4,831,334 | 5/1989 | Hudspeth et al. | 330/10 |

OTHER PUBLICATIONS

Kahn "Single Sideband Transmission By Envelope Elimination and Restoration" Proceedings of the IRE 1952 pp. 803–806.

Krauss "Solid State Radio Engineering" John Wiley & Sons 1980, pp. 517–518.

Kahn "Comparison of Linear Single-Sideband Transmission with Envelope Elimination and Restoration Single Sideband Transmitters" Proceedings of the IRE 1956 pp. 1706–1712.

*Primary Examiner*—Stephen Chin
*Attorney, Agent, or Firm*—Fish & Richardson

[57] ABSTRACT

A narrow band complex input signal, typically having multiple independently modulated carriers, is processed to produce an output signal which, while containing the information in the input signal, is not an amplitude dependent signal, and thus can be transmitted through nonlinear media, such as a saturated power amplifier, as a less expensive and more power-efficient alternative over a conventionally required linear power amplifier. The process separates the multiple input signals into an amplitude-limited angle-modulated carrier component and an envelope component, and then combines these components by a form of pulse-duty-factor modulation such as pulse-duration modulation, at a sufficiently high sampling rate. The combined signal is input to a nonlinear power amplifier. Unwanted sidebands are rejected by bandpass filtering at the amplifier output so as to pass only the carrier and its signal bandwidth. The process can include an optical link interposed in the limited carrier path, utilizing suitable modulation and demodulation at the link input/output. A multiple amplifier embodiment utilizes a bank of parallel nonlinear amplifiers, each of which is driven by a pulse modulator. The amplitude-limited angle-modulated carrier is distributed to the modulators where envelope information is imposed in the form of interleaved sequential pulse-duty-factor modulation. The combined outputs of the nonlinear amplifiers provide the ultimate peak envelope power for transmission.

34 Claims, 8 Drawing Sheets

TRANSMISSION OF MULTIPLE CARRIER SIGNALS IN A NONLINEAR SYSTEM

FIELD OF THE INVENTION

This invention relates to the field of communications and more particularly it addresses processing a narrow band complex signal, typically consisting of multiple signals, in a manner enabling transmission through a nonlinear system such as a saturated power amplifier. In many cases, a highly nonlinear transmission system is a more power-efficient and cost effective alternative to a linear system.

BACKGROUND OF THE INVENTION

It is often necessary to radiate a complex signal, such as one containing multiple carriers, from a single antenna, with each carrier requiring high power to adequately service a wide area. Carriers within a narrow bandwidth may be combined at low level and then transmitted through a common power amplifier; however the amplifier must be linear to preserve the essential information contained in the envelope of the complex signal produced by vector addition of the multiple signals. Any nonlinearity in the amplifier transfer function can result in spurious products, which can sometimes be suppressed by filtering, and cross modulation interference between signals, generally a degradation which cannot be remedied by further processing. Linearity requirements apply to multiple angle-modulated signals, e.g. frequency-modulated and phase-modulated, and even more stringently to amplitude-modulated signals.

Nonlinear power amplifiers, especially when operated in a saturated mode, are a typical example of nonlinear systems which are subject to inherent transmission limitations. These amplifiers can be made inexpensive and power-efficient, however, generally the use of this class of amplifier must be confined to a single isolated angle-modulated or pulse-modulated signal. Where multiple source signals are angle-modulated and sufficiently separated in frequency, they may be amplified in separate nonlinear amplifiers, each dedicated to a channel, and then combined in either a passive high power multiplexer or a power combiner; however such systems tend to be complex and expensive, and would not be applicable to the class containing multiple signals which are closely spaced in frequency within a narrow band and which, in some instances, are amplitude-modulated. These signals are within the class of complex signals addressed by the present invention.

Linear amplifiers typically require enhancement techniques such as feedback and feed forward, (some systems utilizing active feed forward, that is, amplifiers having pilot tone cancellation). Nevertheless, despite its high cost and low power-efficiency, linear power amplification remains the basic conventional approach for handling multiple signals, and is often utilized due to lack of a viable alternative.

DESCRIPTION OF THE PRIOR ART

Various approaches to amplify a complex amplitude and phase modulated signal in a nonlinear amplifier have been patented or otherwise published. These approaches commonly resolve the RF input signal into differently processed paths, in one of which the signal is hard-limited in order to define a phase modulated carrier. The approaches differ in how they address the problem of imposing the envelope back onto the phase modulated carrier. The basic approach was described in "Single Sideband Transmission by Envelope Elimination and Restoration" by L. R. Kahn in the July 1952 *Proceedings of the I. R. E.*, pp. 803–806; and in the December 1956 *Proceedings of the I. R. E.*, pp. 1706–1712, "Comparison of Linear Single-Sideband Transmitters with Envelope Elimination and Restoration Single-Sideband Transmitters", also by L. R. Kahn.

Three basic approaches have been proposed in prior work for restoration of the envelope:

In the first approach, either the collector voltage on a bipolar transistor, or the drain voltage on a field effect transistor (FET), or the plate voltage on a triode are caused to vary as a function of the envelope in such a way that the modulation is imposed on the carrier.

In the second approach, the modulation is applied just prior to the input to the final output stage which is assumed to be linear.

The third approach involves splitting the signal into two paths and phase modulating the two paths such that, when the signal is recombined, the magnitude of the resulting vector is proportional to the envelope.

In L. R. Kahn's original 1952 paper, the modulation was imposed on the plate of a tube by amplifying the detected envelope and transformer coupling it onto the DC plate bias line. U.S. Pat. No. 2,666,133 for this approach was issued to L. R. Kahn for a "Single Sideband Transmitter".

The techniques described in the prior art all suffer from limitations in the practical implementation. As a class, the techniques which apply modulation through some sort of bias control assume a degree of linear transfer of bias voltage to output envelope modulation; however, in reality, this is not the case. Also, there are other problems such as detuning of the output network, AM to PM, and possible amplifier instabilities resulting from changing the bias voltage. The techniques which apply the modulation at the input to the last amplifying device assume that this device is linear. Since this is the highest power device in the amplification chain, it is, in fact, the most likely not to be linear. Finally, the techniques which combine phase modulated paths require a high degree of amplitude and phase tracking in order to achieve high depth of modulation. For instance, a combination of 0.2 dB of amplitude and 3 degrees of phase tracking error will result in a maximum depth of null of 20 dB. This represents a severe limitation on the dynamic range of the modulation.

There exists a similar problem in the case of transmitting complex signals on an optical link such as over a fiberoptic transmission media or a laser beam in free space. Previously, these complex signals were imposed as linear modulation on the signal or else the complex signal was transmitted as a purely pulsed signal using PCM (pulse code modulation). The former generates considerable intermodulation (IM) spurious signals because of the de facto intercept point of the modulation process, and the latter requires very high precision short pulse duration signals at a high pulse rate.

There exists a need in the art for a technique which is compatible with the practical limitations of nonlinear transmission device and media and which will achieve the high degree of modulation linearity and dynamic range required in order to achieve very low IM (intermodulation) distortion in multiple signal applications.

It is therefore an object of the present invention to facilitate amplification of a wide dynamic range signal, such as a multiple carrier signal, using nonlinear amplifiers which have limited or no dynamic range.

It is a further object to enable transmission of a multiple source signal through a nonlinear system by recombining an angle-modulated carrier component derived from the source signal together with source signal envelope information in a non-amplitude-modulated manner.

Another object of the invention is to convert amplitude dynamic range of a multiple carrier signal into a pulse duty factor dynamic range signal to allow the amplification of wide dynamic range signals by nonlinear device at a considerable increase in efficiency over conventional linear and multiplexing practices.

Another object of the invention is to enable a plurality of nonlinear power amplifiers operating in parallel to provide a combined power output signal replicating a multiple signal source.

Another object is to enable a communication link of limited dynamic range, such as an optical link, to accommodate multiple signals through a signal process which converts amplitude modulation to pulse duty factor modulation.

SUMMARY OF THE INVENTION

These objects have been addressed in the present invention by the conversion of envelope amplitude to duty factor variations of a pulse train, typically at a sampling rate at least an order of magnitude higher in frequency than the maximum frequency of the envelope. The pulse train is applied as pulse time modulation onto a carrier signal which is derived from the source signal by hard limiting so as to contain the phase information. The hard-limited carrier signal, keyed on/off by the pulse train, is transmitted through the nonlinear system (such as a saturated amplifier) and then passed through a narrow bandpass filter which eliminates the sidebands introduced by the sampling process. In this manner, the RF amplifier always operates at a constant output level and linearity is not required for proper operation. Additionally, in the case of amplification by power amplifiers whose instantaneous power consumption is a function of the drive signal, the RF signal is pulse-time modulated such that the DC power is a function of the duty factor.

In a multiple amplifier embodiment of the invention, pulse-time modulation is applied in parallel channels at a reduced repetition rat but interleaved in time such that the combined output generally represents a pulse train at the higher desired pulse repetition rate. This increases the dynamic range by the square of the number of channels.

The invention thus relates to a signal processing method and apparatus for enabling a modulated RF source signal to be processed through a nonlinear medium or device, such as a nonlinear power amplifier. The method of the invention features the steps of deriving from the source signal an amplitude-limited, angle-modulated carrier signal containing phase information from the source signal; deriving from the source signal an envelope signal containing amplitude information from the source signal; and deriving from the information in the envelope signal a pulse train signal having pulses which preferably occur at a repetition rate at least an order of magnitude higher than a maximum envelope bandwidth and which have a duty factor which is a function of the amplitude of the envelope signal. The method further features the steps of modulating the carrier signal by the pulse train signal for providing a pulse modulated carrier signal independent of amplitude, but which contains both angle and envelope information relating to the source signal; passing the pulse modulated carrier signal through a substantially nonlinear process so as to provide a processed output signal; and bandpass filtering the processed output signal to recover a linearly related replica of the original source signal.

In another preferred embodiment of the invention, the method and apparatus employ a plurality of nonlinear power amplifiers, operating in parallel, for providing the processed output signal. In accordance with this embodiment of the invention, the envelope signal is converted to a plurality of pulse trains, the pulse trains being staggered in time by one pulse period and each pulse train having a duty factor which is a function of the amplitude of the envelope signal. Thereafter, the carrier signal is modulated by the pulse trains, amplified, and the result is combined to produce an output signal which is thereafter filtered to recover a linear replica of the original source signal.

In a further preferred embodiment, the converting step features the steps of controlling the duty factor and pulse duration of each pulse train over a first region of the envelope dynamic range to have a pulse rate of 1/N of the desired pulse rate for the combined output signal so that the pulses occur at periodic intervals while pulse duration is a function of the amplitude of the envelope signal; inhibiting over a second region of dynamic range, pulses of one or more of the pulse trains so that average output power is reduced in proportion to average duty factor; and increasing pulse duration and duty factor of each of the pulse trains over a third region of dynamic range to generate overlapping pulses in the staggered pulse trains.

BRIEF DESCRIPTION OF THE DRAWINGS

The theory and operation of this invention along with the above mentioned and other objectives and advantages will be best understood from a study of the following description taken along with the accompanying drawings, in which:

FIG. 4a is a graph of the envelope of the signal of FIG. 3a.

FIG. 5a is a graph of the hard limited carrier containing the phase information, as derived from the signal of FIG. 3a.

FIG. 7a is a graph of the carrier of FIG. 5a as pulse duration modulated by the pulse train of FIG. 6a.

FIG. 8 is a frequency domain graph showing the power spectrum of the original two carrier input signal of FIG. 3a.

DETAILED DESCRIPTION OF PARTICULAR EMBODIMENTS

Figure 1:
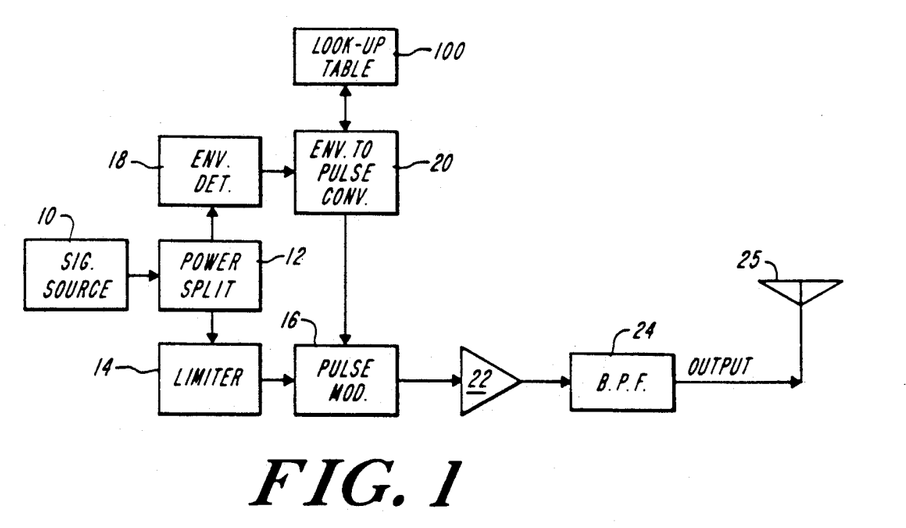
FIG. 1 is a functional block diagram of a processing system for transmitting a multiple component signal through a nonlinear power output amplifier in accordance with the present invention.

FIG. 1 is a functional block diagram of a processing system for transmitting a multiple component signal through a nonlinear power output amplifier in a basic illustrative embodiment of this invention.

An input signal is supplied by a signal source 10 which may include well known conventional frequency conversion means such as a single or double, balanced or active, mixer or other implementations, such as those using single sideband generation techniques, for example to convert to a suitable working frequency band for which circuit components are readily available.

The input signal typically includes, within a narrow bandwidth, multiple carriers which may be angle and/or amplitude modulated. It is divided into two paths in a power splitter 12 which can be a junction of two conductors, a reactive splitter, or a splitter with resistive or magnetic isolation. The power split could be equal or unequal and with any arbitrary phase difference between the two output ports. One port of the splitter 12 feeds a limiter 14, which hard limits the combined carrier signal from splitter 12 and applies the hard-limited carrier signal to a first input port of a pulse modulator 16.

The other output port of power splitter 12 feeds an envelope detector 18 which provides a detected envelope to an envelope-to-pulse converter 20. Converter 20 receives a sampling signal at a frequency at least ten times greater than the envelope bandwidth, and provides as its output a duration modulated pulse train. This pulse train is applied to the second input port of modulator 16, and on/off keys the hard-limited carrier applied to the first input port.

The output of modulator 16 is applied to a nonlinear power amplifier 22 which is operated in a saturated mode for high power efficiency. The power output from amplifier 22 is passed through a narrow band output filter 24 to strip off the sampling sidebands, and is then typically fed to a transmitting antenna 25. No modification of the typical receiver need be made.

Figure 2:
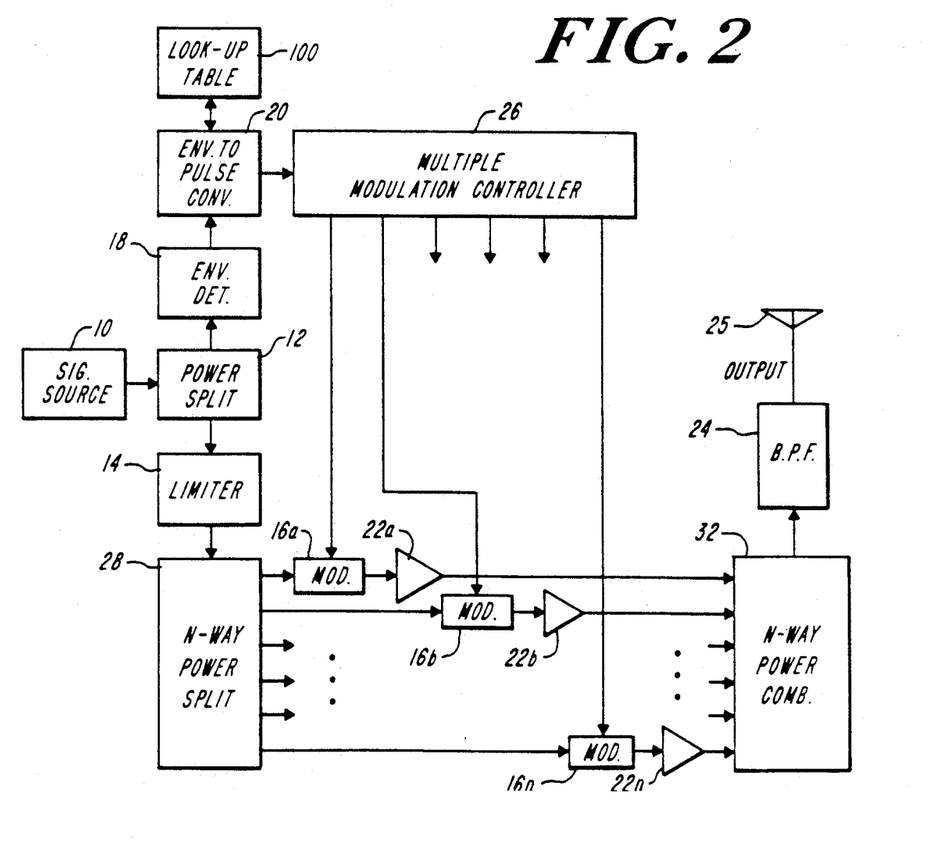
FIG. 2 is a functional block diagram of a processing system for transmitting a multiple component signal through a plurality of parallel nonlinear power output amplifiers in accordance with the present invention.

FIG. 2 is a functional block diagram of a multiple amplifier embodiment illustrating how the principle of the invention can be applied to an application where the required power output is high enough so as to require paralleling multiple RF power output stages. In this embodiment of the invention, it is advantageous to pulse modulate each of a number of parallel channels rather than the common input channel. The functional blocks in the input portion including source 10, power splitter 12, limiter 14, envelope detector 18 and envelope-to-pulse-duty-factor converter 20 are as described above in connection with FIG. 1.

The pulse train output, designated the master pulse train, from converter 20 drives a multiple modulation controller 26 which acts as a commutator, applying the pulses of the pulse train sequentially to each modulator 16(1), 16(2), ... 16(N) such that each modulator operates at 1/N of the rate of pulse train. Accordingly, the inputs to modulators 16(1), 16(2), ..., 16(N) are a plurality (N) of interleaved pulse train signals, staggered in time by one pulse period and having a repetition rate N times lower than that of the master pulse train.

The limited-amplitude output from limiter 14 is split into N parallel channels in an N-way power splitter 28. Splitter 28 can be isolated or non-isolated (that is, it is optional as to whether there exist dissipative elements within the splitter which guarantee that the power into each of the channels is independent of the input impedance into each channel although it is assumed that the impedance is identical in the instance of no isolation). In each channel, a pulse modulator, such as 16(1), 16(2), ... 16(N), drives, respectively, a corresponding nonlinear amplifier such as 22(1), 22(2), ... 22(N), whose outputs are combined in an N-way power combiner 32. Combiner 32 must be isolated, that is, it must contain dissipative elements that guarantee that the operating load impedance presented to each of the channels is independent of the source impedance or source power from each channel.

The combined power output from combiner 32 is passed through bandpass filter 24, typically to an antenna 25. As with the embodiment of FIG. 1, no modification of the receiver need be made.

DETAILED OPERATION

Referring primarily to FIG. 1, and to corresponding elements in FIG. 2, further understanding of the operation of the invention will be gained from the following description.

In the carrier path, hard limiter 14 maintains the phase angle information but eliminates any envelope modulation. Implementation could be a diode limiter, an active limiter, or a combination of both, depending upon the application. Another possibility would be a zero crossing detector (that is, a comparator) which develops a positive output for any signal above zero and a negative or zero output for any signal below zero volts (or visa-versa).

In the envelope detection path from power splitter 12, envelope detector 18 develops the basic envelope waveform, for example, a video envelope waveform. The resulting envelope signal is either always positive or always negative. Any one of a number of techniques for implementing this function can be employed. A simple diode peak detector could be utilized. Another technique utilizes the hard limited carrier delayed to be in quadrature to the modulated carrier so as to be a local oscillator to a balanced mixer and thus develop the modulation using a homodyne technique.

Conversion from the detected envelope to the proper pulse duty factor is accomplished in converter 20 through a number of possible circuit techniques. In a common form of pulse-time modulation, the pulse-duration (or "pulse width") is varied while the pulse repetition rate is held constant, resulting in corresponding variations in duty factor.

Convertor 20 outputs a duration-modulated pulse train where the start of the pulse is always at the same repetition rate but the end of the pulse is variable. A common approach to achieving this is to have the other input to the comparator be a ramp which attains full height (corresponding to the maximum desired value of the envelope) at the end of the clock period. The output of the comparator is a logic high until the ramp exceeds the value of the envelope.

A common analog technique is to have the a sample and hold circuit hold the value of the envelope at the start of each clock period as one input to a comparator. Another technique is to have an analog-to-digital converter sample the signal at the start of ever clock period and then have the sampled value address a lookup table which determines the proper pulse duration value. This value can be passed through a digital-to-analog converter whose output can be utilized as an input to the comparator. An advantage of this latter technique is that overall nonlinearities in convertor 20 can be compensated for in the lookup table.

Another type of pulse train allows symmetrical modulation about the pulse repetition frequency such that the start of the pulse and the end of the pulse are both modulated. A typical version of this circuit utilizes a sample and hold circuit at a point in time equal to or prior to the earliest possible start of a pulse. The sampled signal is input to one side of a comparator circuit which has as its other input an inverted triangle-shaped waveform. A logical high is developed when the envelope is higher than the triangle waveform so that a full width pulse results when the envelope is at or above the predetermined highest level. As the envelope amplitude is reduced, the pulse duration is also reduced in a symmetrical fashion around that center point in time corresponding to the constant pulse repetition frequency.

Since the envelope conversion operates typically in the video frequency range, with commensurate processing times, some form of delay circuit can be provided at the output of limiter 14 to synchronize the hard limited carrier with the processed envelope signal. Specifically, the development of a symmetrical pulse duration waveform, as described above, requires sampling the envelope at a point in time which is earlier than the actual pulse. This situation requires the carrier to be delayed in order to be synchronized with the pulse signal. Such a delay can be implemented in transmission delay lines, surface acoustic wave delay lines, or preferably in a digital memory associated with the limiter 14 itself if the frequencies are low enough.

Once synchronized, the duration-modulated pulse train can then be imposed onto the hard limited carrier in the pulse modulator 16. In operation, modulator 16 passes the RF signal from limiter 14 when the pulse from converter 20 is in a "high" logic state, and gates the RF signal off when the pulse is in a "low" logic state. It is important that the gating process be instantaneous, that is, the RF signal be immediately brought to zero volts at the cessation of the modulation pulse.

The switching function of modulator 16 can be implemented by any one of a number of techniques. Typical techniques employ a doubly balanced mixer as a switch, or else a diode or active element switch, and preferably the new generation of GaAsFET switches. Other techniques could employ gate or base bias modulation, collector or drain modulation, or some combination thereof. In general, any common technique which allows appropriate pulse durations within the range required is acceptable, however, those techniques which minimize switch driver feed through are preferable.

If desired, an optional frequency translation circuit can be implemented at the output of either amplifier 22 or filter 24. The translation technique can be a single sideband generation circuit or a doubly balanced mixer. Amplification of the signal is best effected in a nonlinear amplifier. While the amplifier 22 need not be nonlinear, a nonlinear device works best for the application. The only requirement is that the amplifier be capable of amplifying pulse modulated carriers over the range of desired pulse durations. A major advantage of a nonlinear amplifier, such as a class B or C amplifier is that very little current is drawn when the input signal is gated off. As a result, average consumption is determined by average duty factor. For a signal consisting of a large number of carriers, this is considerably less than 1 (actually averaging out to $N^{-0.5}$ where N is the number of carriers). Finally, the RF output signal from the amplifier 22 is passed through the narrow band output filter 24, which passes the desired spectrum while rejecting the spectrum centered on either side of the desired spectrum around the pulse train sidebands.

In order to understand how the invention works, it is useful to consider its effect on the well understood problem of amplifying two equal amplitude signals closely spaced in frequency, as illustrated in FIGS. 3a–9, in which waveforms and spectrum response have been plotted from mathematical calculations.

Figure 3A:
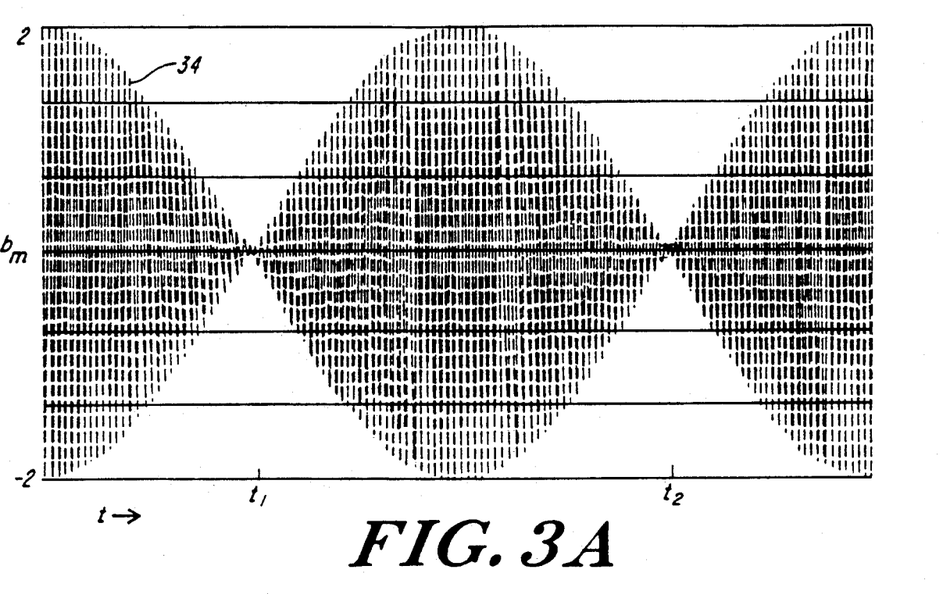
FIG. 3a is a graph of the time domain locus of two equal amplitude signals.

FIG. 3a shows a waveform 34 as the familiar time domain representation of the two signals having an envelope outline which reduces to zero amplitude at periodic points in time such as $t_1$ and $t_2$ each representing a point of phase reversal.

Figure 3B:
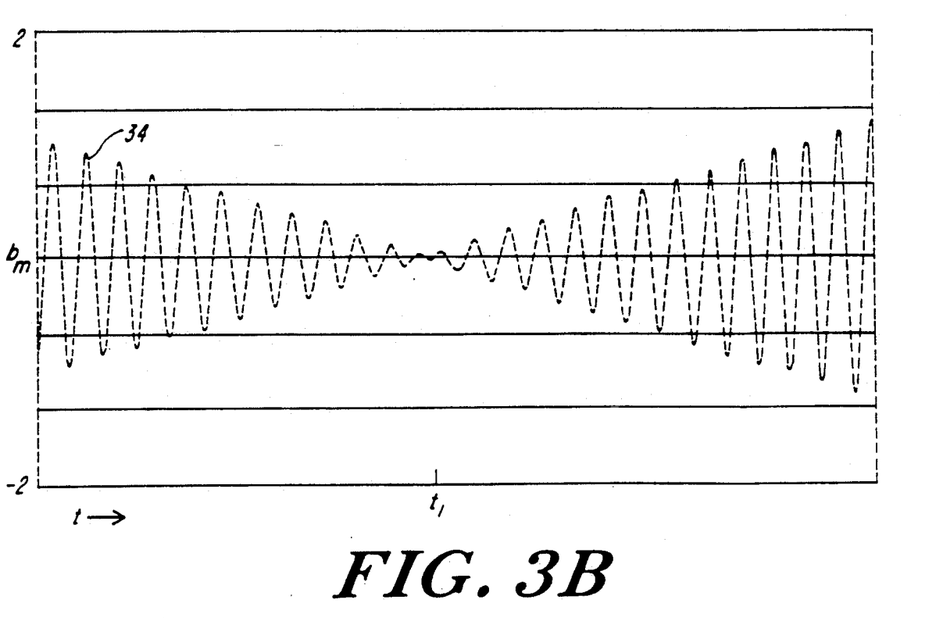
FIG. 3b is a portion of the graph of FIG. 3a expanded around a phase reversal point.

FIG. 3b shows the waveform 34 expanded around time $t_1$, one of the points of phase reversal, to further facilitate understanding the detailed operation of the invention.

Figure 4A:
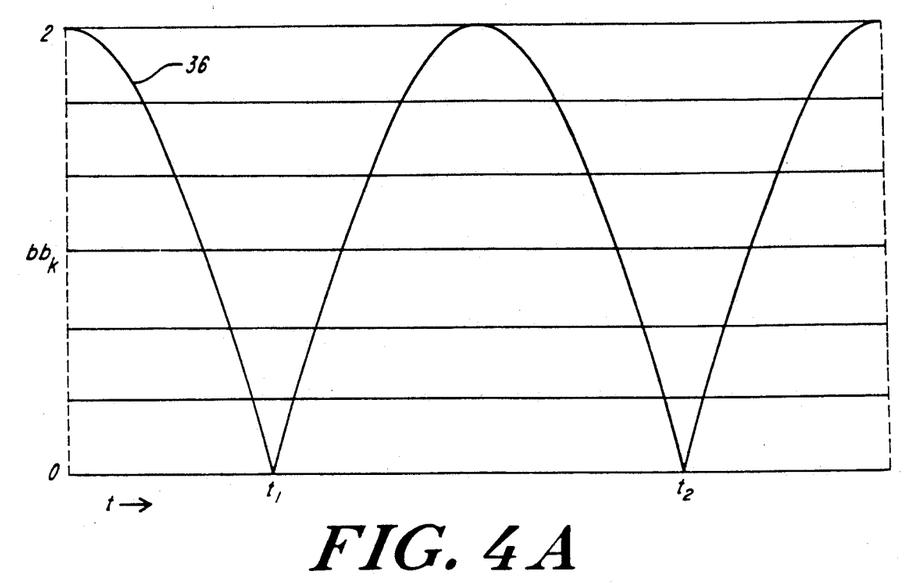
Figure 4B:
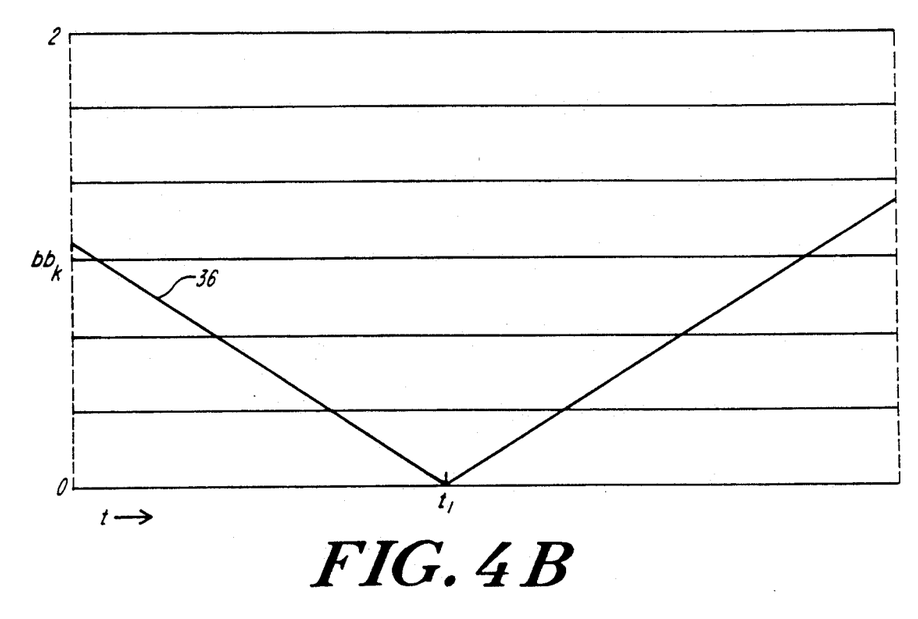
FIG. 4b is a portion of the graph of FIG. 4a expanded around a phase reversal point.

FIG. 4a and FIG. 4b show the detected envelope 36 of the two signals that would be seen at the output of envelope detector 18 (FIGS. 1 and 2) over the entire time span of FIG. 3a and the expanded time frame of FIG. 3b respectively.

Figure 5A:
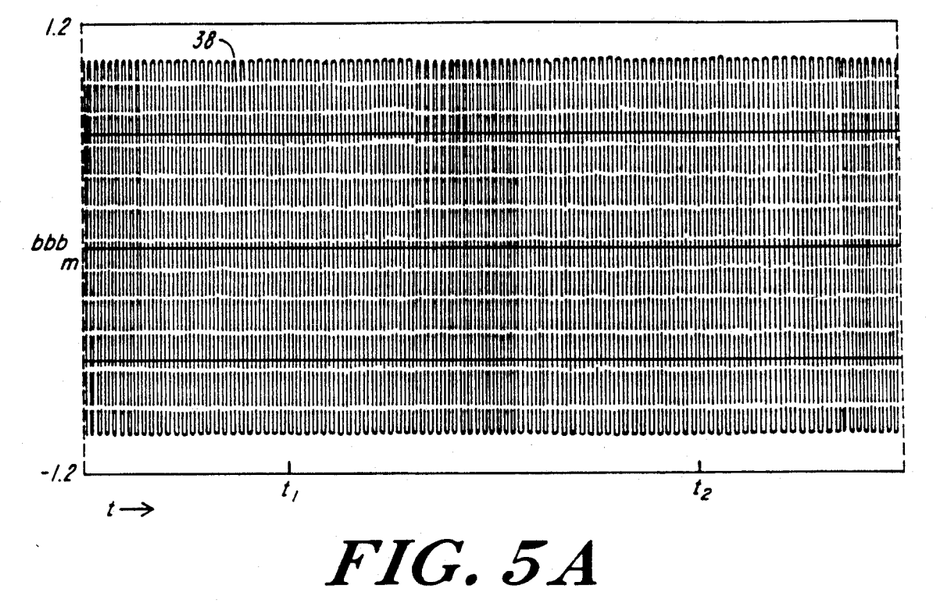
Figure 5B:
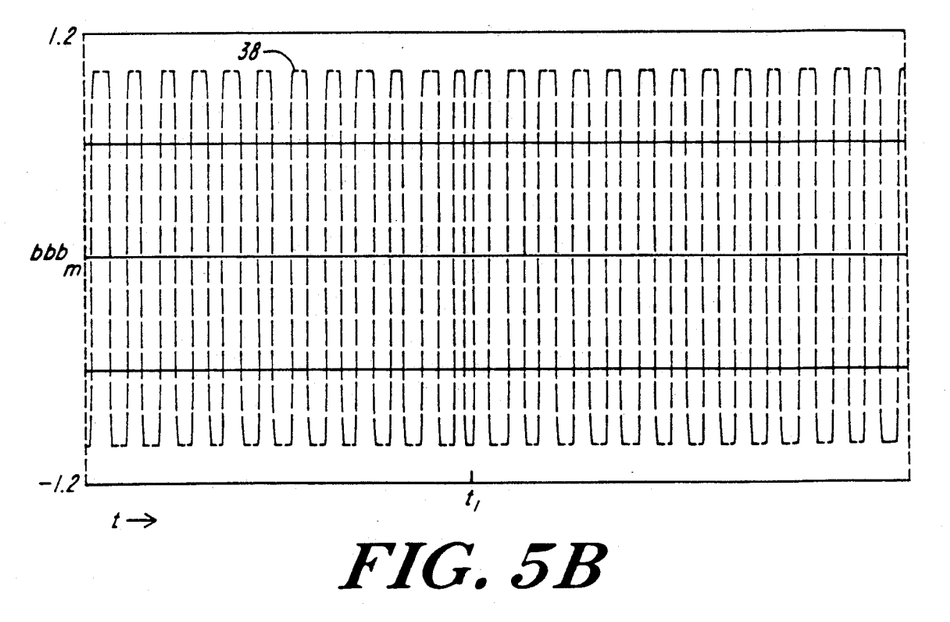
FIG. 5b is a portion of the graph of FIG. 5b expanded around a phase reversal point.

FIG. 5a and FIG. 5b show a waveform 38 of the hard-limited signal from limiter 14 over the corresponding time periods. It can be seen that the output of the envelope detector 18 (waveform 36, FIGS. 4a, 4b) is always positive while the phase reversal is carried forth in the hard limited carrier signal waveform 38.

Figure 6A:
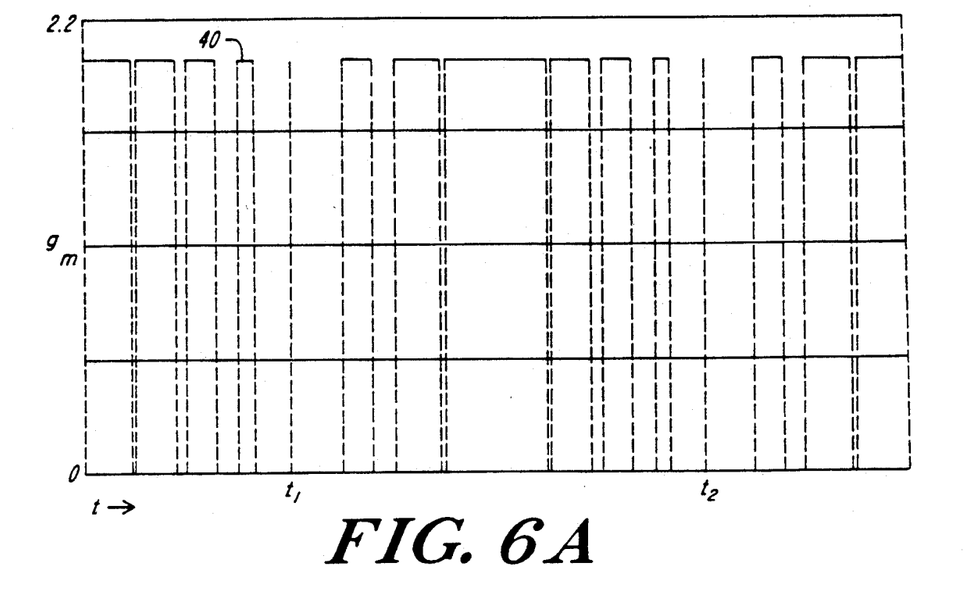
FIG. 6a is a graph of a duration-modulated pulse train as derived from the envelope of FIG. 4a FIG. 6b is a portion of the graph of FIG. 6a expanded around a phase reversal point.
Figure 6B:
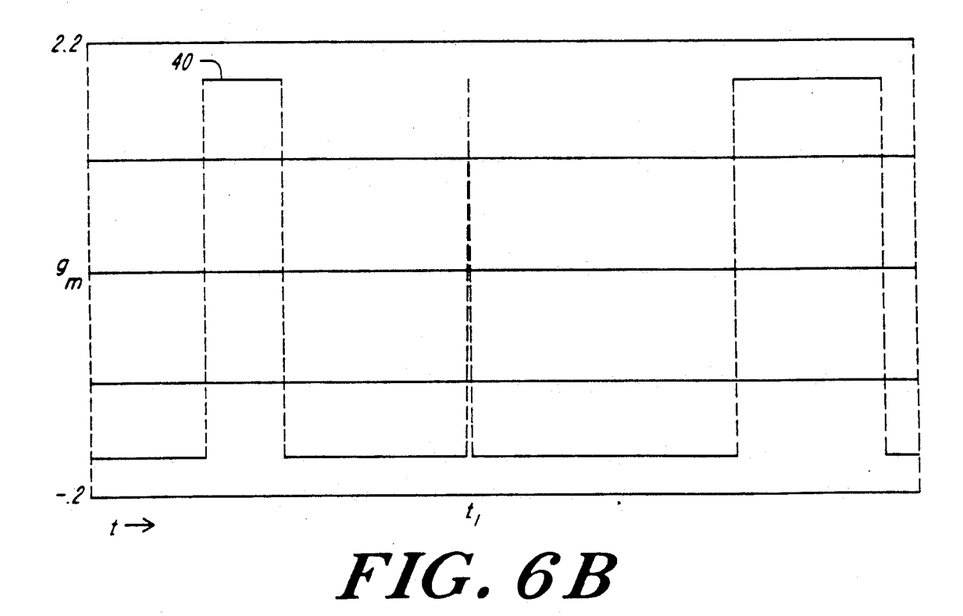

FIG. 6a and FIG. 6b show a waveform 40 of a duration modulated pulse train waveform at the output of converter 20 (FIGS. 1 and 2) over the corresponding time periods. It can be seen that the pulse duration is essentially zero at the times where the envelope is zero, such as at $t_1$ and $t_2$, and the pulse duration is essentially the full period at the times where the signal is at full power. In between, in this illustrated embodiment, the pulse duration, as a percentage of the period of the pulse train, is directly proportional to the amplitude of the envelope relative to its allowable peak amplitude.

Figure 7A:
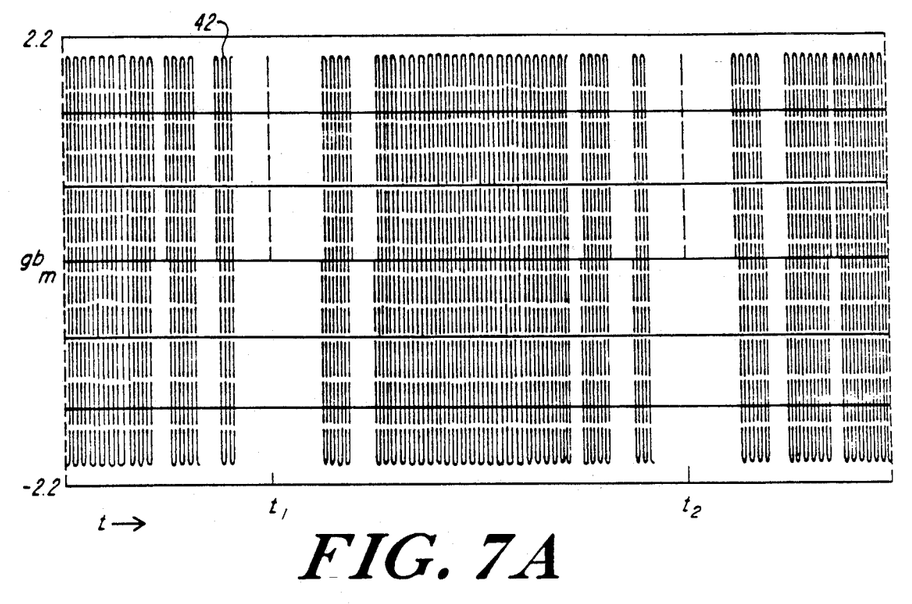
Figure 7B:
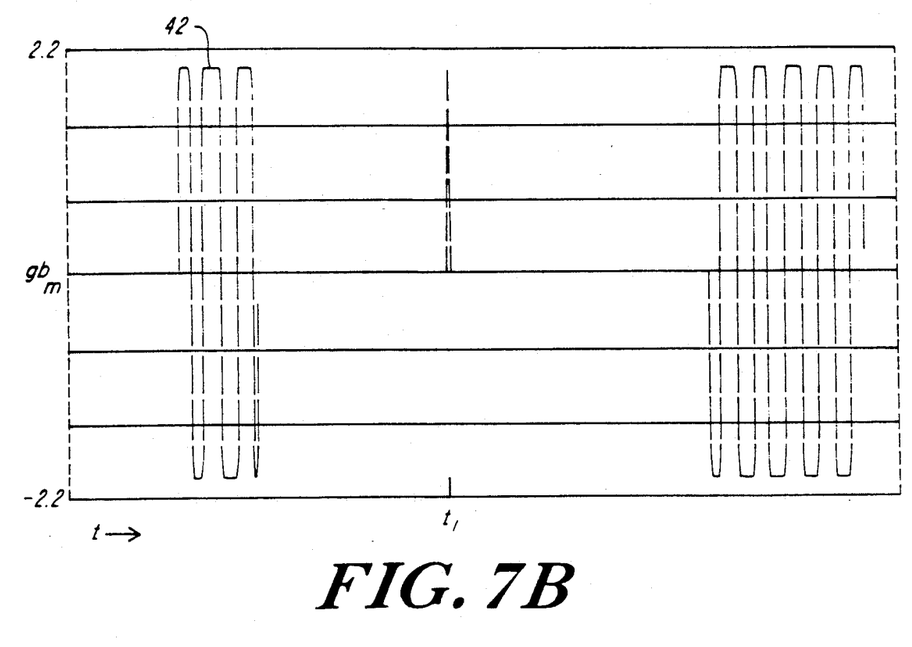
FIG. 7b is a portion of the graph of FIG. 7a expanded around a phase reversal point.

FIGS. 7a and 7b show the output of pulse modulator 16, a time domain waveform 42 of the RF carrier, on/- off gated by the pulse train of FIGS. 6a and 6b, respectively.

Figure 8:
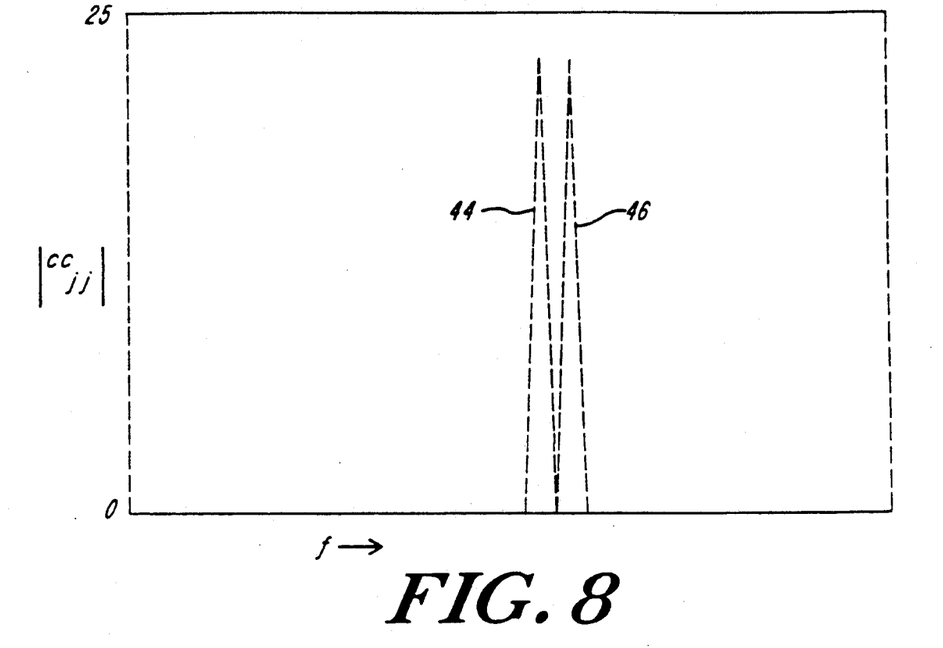

FIG. 8 shows the frequency domain power spectrum of the two equal carrier signals in the input signal from source 10 (FIGS. 1 and 2), appearing as two band limited peaks 44 and 46 about the respective carrier frequencies.

Figure 9:
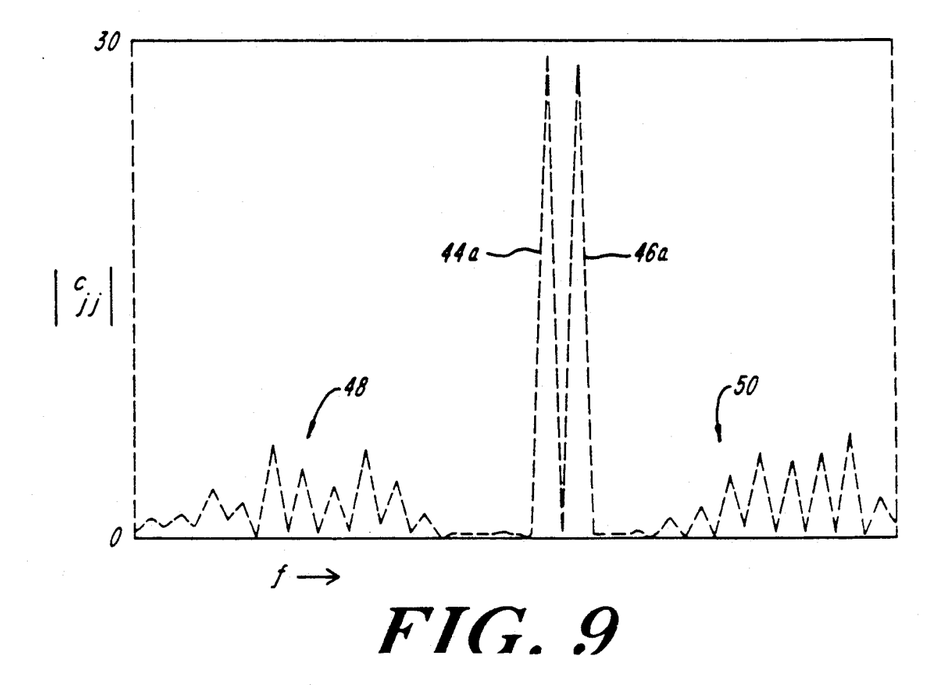
FIG. 9 is a frequency domain graph showing the power spectrum of the pulse duration modulated carrier of FIG. 7a indicating the restored spectrum in the immediate vicinity of the carriers, and showing the spurious sidebands generated by the pulse sampling process.

FIG. 9 shows the frequency domain power spectrum of the modulated carrier of FIGS. 7a and 7b. It can be seen that the original power spectrum of the carrier signals is present around the respective original carrier frequencies, appearing as peaks 44a and 46a, and in addition, there is introduced spurious sidebands 48 and 50 due to the sampling process.

The operation of the invention may be understood analytically by considering that a complex RF waveform can be always broken into an amplitude and phase modulated signal. In the subset of signals around an arbitrarily chosen mid frequency of fo, an arbitrary input signal, y(t), can be represented as:

$$y(t) = A(t) * sin(2*\pi*fo*t + \phi(t))$$

where
  A(t) is the amplitude function, and
  $\phi$(t) is the phase modulation function.

By hard limiting the input RF signal, the angle modulated function is reproduced. In the present invention, the information content of the envelope function A(t) is preserved by sampling it, converting the sampled values to a pulse duration and multiplying the carrier by the resulting duration modulated pulse train. If it is assumed that the pulse train repetition rate is considerably higher in frequency than the maximum frequency component of the envelope, then a quasi static analysis applies. For an infinite pulse train of duty factor, , and period, T, the standard Fourier transform is a discrete series of the form:

$$y(t) = \sigma + \sum_{n=1}^{\infty} \frac{|2*\sigma*sin(n*\pi*\sigma)| * cos(n*2*\pi*t/T + \theta n)}{|n*\sigma*\pi|}$$

where: $\theta$ n is the phase angle of each discrete spectral line.

It can be seen that the series is of the form of a discrete set of spectral frequency lines at multiples of 1/T in frequency with the familiar envelope of sin(x)/x and with the "DC" component being just the duty factor.$\sigma$. When this is multiplied times the carrier waveform in the time domain, it is equivalent to convolution in the frequency domain. The resulting Fourier spectrum consists of the Fourier transform of the carrier convolved around not only the carrier, but also around all of the sidebands at multiples of 1/T away from the carrier. If 1/T is much higher in frequency than the maximum bandwidth of the modulation, then the other sidebands are easily filtered out leaving only the spectrum of the carrier with an amplitude directly proportional to $\sigma$. Since this is a quasi-static analysis, the value of $\sigma$ can be assumed to vary with time directly proportional to the envelope. As a result, the voltage magnitude of the resulting signal is directly proportional to the input envelope amplitude.

A more exact analysis of the spectrum of the dynamically pulse duration modulated pulse train is required to determine the conditions for which significant interference sidebands will be found in the bandwidth of the desired signal. Since the preceding analysis shows that pulse duration modulation of the carrier in the time domain results in convolution of the carrier signal with the power spectrum of the pulse duration modulated pulse train in the frequency domain, it is only necessary to analyze the frequency spectrum of the pulse duration modulated pulse train. A number of references provide exact dynamic analyses of a pulse duration modulated signal (see for instance, "Modulation, Noise, and Spectral Analysis", by P. F. Panter, McGraw-Hill, 1965, pp. 540-543). These exact analyses indicate a complex amplitude distribution for the sidebands but a DC component which is directly proportional to the duty factor. In other words, the dynamic analysis agrees with the static analysis of the low frequency components of the pulse duration modulated spectrum. For the case of a pulse duration modulated pulse train at pulse repetition frequency, fr, and modulation frequency, fm, the time domain representation of a sine waveform can be transformed to a Fourier series representation given by:

$$y(t) = A*(1 + sin(wm*t) +$$

$$\sum \frac{(4*Jl(k*\pi)* (-1)^{k}*cos(wr*t)*sin(wr*t)))}{(k*\pi)}$$

$$k = 1,3,5 \ldots \infty$$

where: wm=2*$\pi$*fm
  wr=2*$\pi$*fr
  A=constant related to the amplitude of the pulse train
  J1: is a Bessel Function of the first type As can be seen from this equation, the low frequency spectrum is directly proportional to the magnitude of the envelope (here assumed to be given by 1+sin(wm*t), that is 100% modulation). Expanding this equation in the frequency domain yields a considerable number of spectral lines but interference lines within the bandwidth of the modulation are typically less than −100 decibels below the carrier (dBc) with respect to the modulation in the case of pulse repetition rates which are at least an order of magnitude higher than the highest envelope frequency. Use of a bandpass filter on the RF waveform which has a bandwidth comparable to the bandwidth of the RF signal (as opposed to the bandwidth of the envelope which is equal to or greater than the RF bandwidth) will leave only the original RF waveform. What has been accomplished is that the original RF signal has been amplified at a constant level. It would make no difference to the ultimate output waveform if the output amplifier were linear or hard saturated, however, a hard saturated, class C amplifier has the advantage that DC power consumption decreases considerably when no signal is present. As a result, the average power consumption of the pulse modulated amplifier is reduced from a continuous wave case to the overall average duty factor. If a Class C amplifier is employed, then it can only practically be operated at full saturated power output, because the efficiency and gain degrade considerably when operated at levels less than saturation.

The previous example thus describes the use of pulse duration modulation as a means of adjusting the quasi static duty factor to correspond to the height of the envelope of the signal. This is not the only pulse-time modulation technique that will accomplish this goal. Another technique is to maintain the duration of the pulses constant and to vary the pulse repetition rate.

that is the pulse interval, in such a manner that the quasi static average duty factor is proportional to the amplitude of the envelope signal.

A version of this approach is to maintain the pulse repetition rate constant and to pulse duration modulate but to allow the pulse duration to be reduced to some minimum width and thereafter to eliminate some of the periodic pulses. For instance, if every other pulse were eliminated, the resulting duty cycle would be half that of the full rate pulse train and the effective envelope voltage would be half that of the full rate envelope. Ultimately, the use of pulse duty factor modulation can be implemented by any mixture of pulse duration modulation and pulse repetition rate modulation to achieve envelope restoration by control of the quasi static duty factor of the modulated RF waveform. Any of these waveforms take advantage of the fact that the signal amplitude resulting from operations upon the pulse modulated waveform is constant and thus requires no dynamic range linearity in the power amplifier (or other nonlinear transmission media).

Returning to the multiple processing system of FIG. 2, a more detailed analysis follows.

Figure 10:
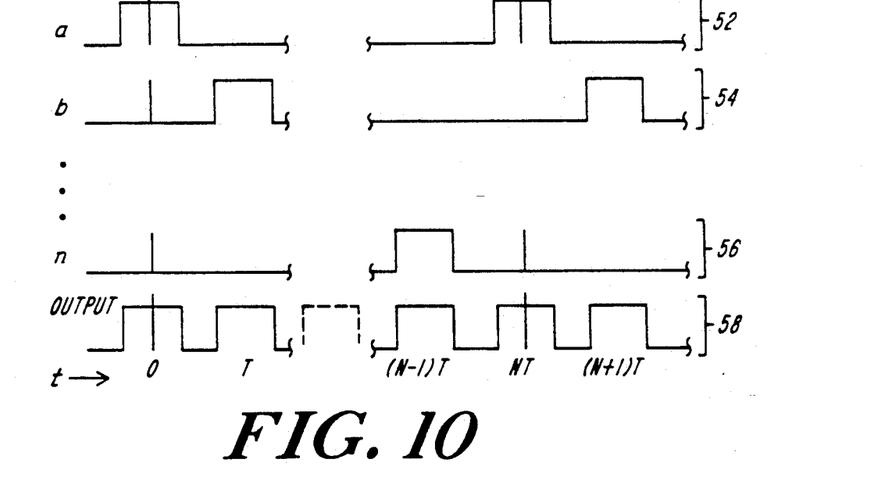
FIG. 10 is a graphical representation of the waveforms of N interleaved pulse trains and their recombination in the multiple processing system of FIG. 2.

Referring to FIG. 10, waveforms 52, 54, and 56 represent the pulse trains handled by each of the amplifiers 22(1), 22(2) ... 22(N) respectively (of FIG. 2). The staggered relation of the waveforms, as shown, results in the combined waveform 58 at the output of power combiner 32. It should be understood that, while only three of the parallel modulator amplifier channels (1, 2 and N) are shown as typical, the system may be designed with any number of like channels, the number N being determined primarily by the total power requirement, the power capability of each amplifier, and as described below, the dynamic range of the input signal envelope.

The staggered relation of the waveforms illustrated in FIG. 10 provides a unique advantage for obtaining an extended dynamic range at substantially no system cost. In order to understand the method for obtaining the extended dynamic range, a similar, but more limited form of the technique will be described in connection with the single channel embodiment of FIG. 1, and then is extended to the multiple channel embodiment of FIG. 2.

Assume that the maximum pulse duration is T and that, for whatever reason, (for example implementation factors such as system bandwidth and amplifier rise and fall time), the minimum achievable pulse duration is $\tau_{min}$. As noted above, the output amplitude from the bandpass filter 24 is proportional to the duty cycle for a pulse signal having a constant pulse repetition rate. Accordingly, if the minimum amplifier pulse width is 0.1*T, then a single channel system, sampling at a rate (1/T), will result in a dynamic range of 20 dB, as the pulse duration width ranges from 0.1*T to T.

The dynamic range, according to the invention can be extended by varying the pulse modulation technique over different parts of the envelope dynamic range. As an example, in the single channel case of FIG. 1, as noted above, it is assumed that the output signal is sampled at a rate of 1/T with pulse widths reduced from T to the minimum pulse width of $\tau_{min}$. This allows the amplifier to duplicate an input amplitude envelope having a range from 1 to ($\tau_{min}$/T). In accordance with this aspect of the invention, for input signals lower than ($\tau_{min}$/T), the repetition rate can be decreased, while maintaining the pulse width constant at $\tau_{min}$. The amplitude range of minimum output signal can then be further reduced to ($\tau_{min}$/T$_{increased}$) where the sampling period, T$_{increased}$, is greater than the original sampling period. This increased sampling period causes the sideband spurious signals to be closer to the desired signal, but because this undesirable side effect only occurs with low signal levels, the amplitude of the closer sidebands are greatly reduced.

As an example, if the minimum output pulse width were 0.1*T such that the output dynamic range would normally be 20 dB (at a repetition rate T), the pulse period can be continuously increased from T to 4*T to transmit amplitude information below the original 20 dB dynamic range (the pulse width remaining constant at 0.1 T). In this manner, the output dynamic range is increased by an additional 12 dB, to a total of 32 dB. An alternative embodiment combines varying the pulse width and the sampling period over the lower part of the envelope dynamic range. Use of a look-up table 100 in the envelope to pulse modulation circuitry can be utilized to effect and control this method of dynamic range extension.

This technique of dynamic range extension, by varying the pulse modulation technique over different sections of the input dynamic range, as discussed in the preceding paragraph, can also be extended to the embodiment of staggered pulse modulation used with the multiple parallel channel amplifier illustrated in FIGS. 2 and 10.

In the case of the multiple parallel channel amplifier, the dynamic range can be preferably increased by eliminating pulses from some of the parallel channels for very low envelope voltages. If only 1 of the N parallel channels is operated, then the resulting output composite signal is just a pulse train at a rate of 1/(N*T), that is, at 1/N the basic pulse train rate. At that duty factor, assuming that the pulse duration is maintained at min, the output power in the signal is reduced by another 1/N$^2$. In general, if only M of the N parallel channels are operated, then the signal power in the composite output signal is (M/N)$^2$ of the signal power when all channels are operating. In the example of the 4 channels, this would provide up to an additional 12 dB of dynamic range. Utilizing a look up table 100 can provide a continuously varying pulse duration as channels are eliminated so as to insure that there exists a smooth reduction in output power over the full dynamic range.

Accordingly, therefore, the dynamic range of the output signal can be increased by reducing the duty factor from 100% to some substantially lower number both for a single channel as well as a multiple channel environment. In addition, however, in the multiple channel environment, the dynamic range can be further extended by increasing the pulse duration on each of the channels to a value greater than T and in the extreme, to a duration equal to N*T. In particular, the pulse duration on each channel, shown at an intermediate value in FIG. 10, can vary from the minimum achievable pulse duration min (limited as noted above, only by implementation factors such a system bandwidth and amplifier rise and fall time considerations) at a pulse repetition rate of 1/(N*T), up to a maximum pulse duration of N T in each channel (occurring at the same repetition rate 1/(N*T)). Once the pulse duration on each channel exceeds T, the combined output 58 from the overall amplifier will be a continuous wave (cw) signal (that is a continuous signal having a 100% duty factor) having superimposed therein, a time varying pulse envelope.

The continuous wave signal has the maximum available output power from the amplifier, $P_{max}$, given by $N*P_{channel}$, where $P_{channel}$ is the RF power developed on each channel when the channel pulse duration is $N*T$. Thus the composite output signal 58 can be a pulse train that varies in pulse duration from the minimum possible pulse duration, $\tau_{min}$, occurring at a rate of $1/T$ up to a cw signal (at a full power output).

When the output pulse on each channel consists of pulses having a duration $\tau$ less than or equal to T, the power contribution from each of the channels to the filtered output of the filter 24 is $[\tau/(N*T)]^2$ of the overall maximum available power. The additional attenuation is due to the property of isolated combiners that when M of N channels are operating simultaneously (and assumed to have equal and in phase output), the total RF output power in the frequency band of interest is given by $(M/N)^2$ of the total available power when all N of the channels are operating simultaneously. As the pulse duration on each channel increases from $\tau_{min}$ up to a maximum of $N*T$, the composite signal becomes a superposition of time coincident signals such that the output waveform repeats every T seconds with part of the period consisting of the superposition of M channels (resulting in instantaneous composition output $(M/N)^2*P_{max}$) and the other part of the period consisting of the superposition of $M-1$ channels (resulting in instantaneous composite output of $((M-1)/N)^2*P_{max}$). In general, it can be shown that the composite RF output power from the multiple channel amplifier is given by:

$$P_{total} = (\tau/(N*T))^2 * P_{max}$$

$$for\ 0 < \tau < N*T$$

It can be seen that this technique extends the dynamic range of the pulse duration modulation by a factor of $N^2$ (as increases from T to $N*T$). As an example, if the amplifier rise time and/or bandwidth limit the minimum amplifier pulse width to $0.1*T$, then a single channel system, sampling at rate $(1/T)$, will result in a dynamic range of 20 dB as the pulse train increases from $\tau = 0.1*T$ to $\tau = T$. However, if each channel of a 4 channel amplifier is allowed to vary from $0.1*T$ up to $4*T$, in accordance with this aspect of the invention, the dynamic range is increased by $(4)^2$ or 12 db; and further, as noted above, if certain channels are selectively eliminated, an additional 12 dB of dynamic range is achieved (for 4 channel example).

Figure 11:
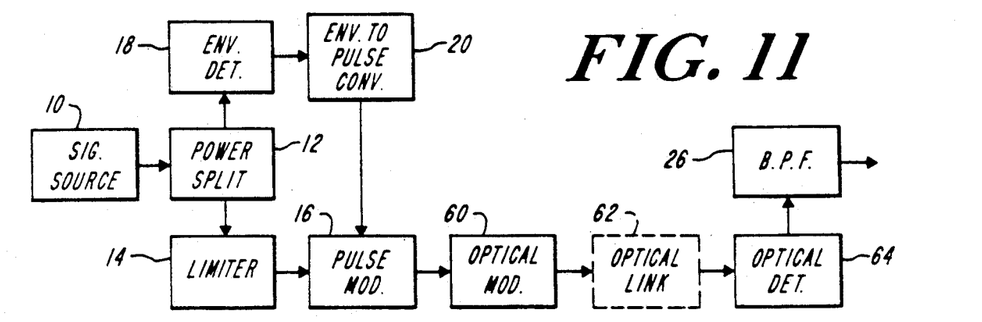
FIG. 11 is a functional block diagram of an embodiment of the invention incorporating an optical communication link following the pulse modulator.

FIG. 11 is a functional block diagram illustrating how the basic technique of this invention, as described in connection with FIG. 1, can be extended in frequency for utilization in an optical link. The RF signal, from pulse modulator 16 in FIG. 1, is used to amplitude modulate an optical source (such as a solid state laser) in a modulator 60. The optical output is then transmitted across an optical link 62 to an optical detector 64. The output of this detector will be the pulsed RF signal which can be passed through bandpass filter 26 whereby the complex signal is again restored.

Figure 12:
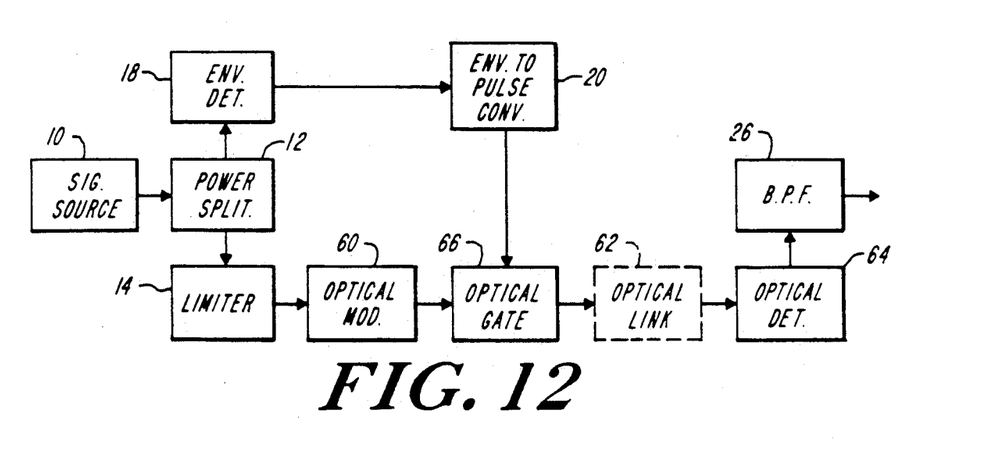
FIG. 12 is a functional block diagram of an embodiment of the invention having an optical communication link which includes a portion of the pulse modulator.

FIG. 12 is a functional block diagram illustrating utilization in an optical link similar to that shown in FIG. 11 except that the amplitude limited signal is applied directly to the optical modulator 60 without being pulse modulated. The pulse modulation, whose duty factor is proportional to the amplitude of the envelope of the original complex signal, is then used to directly modulate the optical beam through an optical pulse gate modulator 66. As in FIG. 11, the resulting detected signal out of optical detector 64 is the pulsed RF signal which is passed through bandpass filter 26 and restored to its original complex waveform. Thus, as in FIG. 11, a complex signal can be sent on an optical link without requiring amplitude linearity.

The invention may be embodied in still other specific forms without departing from the spirit and essential characteristics thereof. The present embodiments are therefore to be considered in all respects as illustrative and not restrictive, the scope of the invention being indicated by the appended claims rather than by the foregoing description; and all variations, substitutions and changes which come within the meaning and range of equivalency of the claims are therefore intended to be embraced therein.

What is claimed is:

1. A signal processing method for enabling a modulated radio frequency source signal to be processed through a nonlinear power amplifier while achieving substantially linear amplification, the method comprising the steps of:
    (a) deriving from the source signal an amplitude-limited angle-modulated carrier signal containing phase information from the source signal;
    (b) deriving from the source signal an envelope signal containing amplitude information from the source signal;
    (c) deriving, from the envelope signal, a pulse train signal having pulses which occur at a repetition rate at least an order of magnitude higher than a maximum envelope bandwidth and which have a duty factor which is a function of the amplitude of the envelope signal;
    (d) modulating the carrier signal by the pulse train signal for providing a pulse modulated carrier signal independent of amplitude, and which contains both angle and envelope information of the source signal;
    (e) passing the pulse modulated carrier signal through a nonlinear amplification process to generate an amplified output signal; and
    (f) bandpass filtering the amplifier output signal to recover an amplified replica of the original source signal.

2. The signal processing method of claim 1 wherein the pulse train deriving step comprises the step of deriving pulses having a time duration proportional to a function of the amplitude of the envelope signal and occurring at constant periodic intervals.

3. The signal processing method of claim 1 wherein the pulse train deriving step comprises the step of deriving pulses having a constant time duration and occurring at a varying repetition rate which is a function of the amplitude of the envelope signal.

4. The signal processing method of claim 1 wherein the pulse train deriving step comprises the step of varying said pulses in both duration and rate such that
    over a first portion of a dynamic range of the envelope signal the pulses are made to occur at periodic intervals and to have a duration which is a function of the amplitude of the envelope signal, and
    over a second portion of the dynamic range, the pulses are made to have constant duration and are made to vary in pulse rate as a function of amplitude of the envelope signal.

such that the resultant pulses are caused to vary in duty factor in a predetermined relationship with the amplitude of the envelope signal.

5. The signal processing method of claim 1 wherein the pulse train deriving step comprises the step of addressing a lookup table for determining a pulse duty factor in response to an envelope signal amplitude.

6. A signal processing method for enabling a modulated radio frequency source signal to be transmitted through a plurality, N, of nonlinear power amplifiers operating in parallel, the method comprising the steps of:

(a) deriving from the source signal an amplitude-limited angle-modulated carrier signal containing phase information from the source signal;

(b) deriving from the source signal an envelope signal containing amplitude information from the source signal;

(c) converting the envelope signal to a master pulse train having a pulse repetition rate greater than ten times the maximum bandwidth of the envelope signal and having a duty factor which is a function of the amplitude of the envelope signal;

(d) deriving from the master pulse train a quantity of N interleaved pulse trains, staggered in time such that each interleaved pulse train has a repetition rate N times lower than that of the master pulse train;

(e) modulating the carrier signal by each said interleaved pulse train to generate corresponding modulated signals;

(f) amplifying each modulated carrier signal through a nonlinear process to produce a corresponding power output;

(9) combining the power outputs from each of the N amplifiers to produce a combined output signal; and (h) filtering the combined output signal through a bandpass filter to recover an amplified replica of the source signal.

7. The signal processing method of claim 6 wherein the converting step comprises the steps of
modulating each interleaved pulse train over a first region of envelope dynamic range at a rate of 1/N of a desired rate such that pulses occur at periodic intervals while pulse duration is a function of amplitude of the envelope signal, and inhibiting over a second region of the dynamic range, pulses of one or more of the interleaved pulse trains whereby average output power is reduced in proportion to average duty factor.

8. A method for sending information, originating as a modulated ratio frequency signal, over an optical transmission link without requiring linear amplitude modulation of an optical signal, the method comprising the steps of:

(a) amplitude limiting the radio frequency signal;

(b) envelope detecting the envelope of the original radio frequency signal;

(c) pulse modulating the amplitude limited radio frequency signal by a signal whose duty factor is a function of the envelope of the original radio frequency signal;

(d) amplitude modulating the optical signal with the pulse modulated radio frequency signal to produce a pulse modulated optical signal;

(e) transmitting the pulse modulated optical signal;

(f) receiving the transmitted pulse modulated optical signal at the receiver side; and (g) filtering the detected radio frequency signal in a bandpass filter for recovering the original signal.

9. A method for sending information, originating as a modulated radio frequency signal having a modulation envelope, over an optical transmission link without requiring linear amplitude modulation of an optical signal, the method comprising the steps of:

(a) amplitude modulating the optical signal with a constant amplitude radio frequency signal;

(b) directly pulse modulating the amplitude modulated optical signal with a pulse train whose duty factor is a function of the envelope of the original radio frequency signal;

(c) detecting the pulse modulated optical signal at the receive side; and (d) bandpass filtering the resulting detected radio frequency signal to generate a replica of said modulated radio frequency signal.

10. An electronic signal processing system for high efficiency power amplification of a modulated radio frequency signal, comprising:

a limiter for amplitude limiting said radio frequency signal to produce a carrier signal having phase angle modulation in accordance with said radio frequency signal;

an envelope detector adapted to detect from the radio frequency signal an envelope signal having an amplitude corresponding to that of the radio frequency signal;

a pulse source adapted to provide a train of pulses recurring at a rate at least an order of magnitude greater than a maximum bandwidth of the envelope signal and having a duty factor which is a function of said envelope signal;

a pulse modulator for modulating the carrier signal in accordance with the train of pulses to produce a combined modulated signal independent of amplitude and containing amplitude and phase information of the original radio frequency signal;

a nonlinear power amplifier for amplifying the combined modulated signal to produce a combined power signal; and a bandpass filter responsive to the combined power signal to generate a bandpass signal corresponding to a linearly amplified radio frequency signal.

11. The signal processing apparatus of claim 10 wherein the pulse source comprises means for deriving pulses having a time duration proportional to a function of the amplitude of the envelope signal and occurring at constant periodic intervals.

12. The signal processing apparatus of claim 10 wherein the pulse source comprises means for deriving pulses having a constant time duration and occurring at a varying repetition rate which is a function of the amplitude of the envelope signal.

13. The signal processing apparatus of claim 10 wherein the pulse source comprises means for varying said pulses in both duration and rate such that
over a first portion of a dynamic range of the envelope signal the pulses are made to occur at periodic intervals and to have a duration which is a function of the amplitude of the envelope signal, and
over a second portion of the dynamic range, the pulses are made to have constant duration, and are made to vary in pulse rate as a function of amplitude of the envelope signal.

such that the resultant pulses vary in duty factor in a predetermined relationship with the amplitude of the envelope signal.

14. The signal processing apparatus of claim 10 wherein the pulse source comprises
a look-up table, and
means for addressing said look-up table for determining a pulse duty factor in response to an envelope signal amplitude.

15. A signal processing method for non-linearly processing a modulated, radio frequency source signal while effecting a substantially linear transformation of the signal, the method comprising the steps of:
(a) deriving from the source signal an amplitude-limited angle-modulated carrier signal containing phase information from the source signal;
(b) deriving from the source signal an envelope signal containing amplitude information from the source signal;
(c) deriving, from the envelope signal, a pulse train signal having pulses which occur at a pulse repetition rate and which have a duty factor which is a function of the amplitude of the envelope signal;
(d) modulating the carrier signal by the pulse train signal for providing a pulse modulated carrier signal independent of amplitude, and which contains both angle and envelope information of the source signal;
(e) processing the pulse modulated carrier signal through a nonlinear process to generate a processed output signal; and
(f) bandpass filtering the processed output signal to recover a linearly related replica of the original source signal.

16. A signal processing method for enabling a modulated radio frequency signal to be transmitted through a plurality, N, of nonlinear power amplifiers operating in parallel, the method comprising the steps of:
(a) deriving from the source signal an amplitude-limited angle-modulated carrier signal containing phase information from the source signal;
(b) deriving from the source signal an envelope signal containing amplitude information from the source signal;
(c) converting the envelope signal to a plurality of pulse trains, said covering step comprising the step of interleaving said pulse trains by staggering, in time, by one pulse period each said pulse train, and each pulse having a duty factor which is a function of the amplitude of the envelope signal;
(d) modulating the carrier signal by each said interleaved pulse train to generate corresponding modulated signals;
(e) processing each modulated carrier signal through a substantially nonlinear process to produce a corresponding output signal;
(f) combining the processed output signals to produce a combined output signal; and
(g) filtering the combined output signal through a bandpass filter to recover a linear replica of the source signal.

17. The signal processing method of claim 16 wherein the converting step comprises the steps of
controlling the duty factor and pulse duration of each pulse train over a first region of envelope dynamic range rate to have a pulse rate of 1/N of a desired pulse rate for the combined output signal such that pulses occur at periodic intervals while pulse duration is a function of amplitude of the envelope signal,
inhibiting over a second region of the dynamic range, pulses of one or more of the interleaved pulse trains whereby average output power is reduced in proportion to average duty factor, and
increasing pulse duration of each pulse train over a third region of dynamic range to generate overlapping pulses in said pulse trains.

18. A signal processing method of processing an envelope signal and an angle-modulated carrier signal through a nonlinear power amplifier for achieving substantially linear amplification of the combined signal, the method comprising the steps of:
(a) deriving, from the envelope signal, a pulse train signal having pulses which occur at a repetition rate at least an order of magnitude higher than a maximum envelope bandwidth and which have a duty factor which is a function of the amplitude of the envelope signal;
(b) modulating the carrier signal by the pulse train signal for providing a pulse modulated carrier signal independent of amplitude, and which contains both angle information of the carrier signal and envelope information of the envelope signal;
(c) passing the pulse modulated carrier signal through a nonlinear amplification process to generate an amplified output signal; and
(d) bandpass filtering the amplifier output signal to recover an amplified replica of the combined signal.

19. The signal processing method of claim 18 wherein the pulse train deriving step comprises the step of deriving pulses having a time duration proportional to a function of the amplitude of the envelope signal and occurring at constant periodic intervals.

20. The signal processing method of claim 18 wherein the pulse train deriving step comprises the step of deriving pulses having a constant time duration and occurring at a varying repetition rate which is a function of the amplitude of the envelope signal.

21. The signal processing method of claim 18 wherein the pulse train deriving step comprises the step of varying said pulses in both duration and rate such that
over a first portion of a dynamic range of the envelope signal the pulses are made to occur at periodic intervals and to have a duration which is a function of the amplitude of the envelope signal, and
over a second portion of the dynamic range, the pulses are made to have constant duration and are made to vary in pulse rate as a function of amplitude of the envelope signal,
such that the resultant pulses are caused to vary in duty factor in a predetermined relationship with the amplitude of the envelope signal.

22. The signal processing method of claim 18 wherein the pulse train deriving step comprises the step of addressing a lookup table for determining a pulse duty factor in response to an envelope signal amplitude.

23. A signal processing method of enabling an envelope signal and an angle-modulated carrier signal to be transmitted through a plurality, N, of nonlinear power amplifiers operating in parallel, the method comprising the steps of:
(a) converting the envelope signal to a master pulse train having a pulse repetition rate greater than ten times the maximum bandwidth of the envelope signal and having a duty factor which is a function of the amplitude of the envelope signal;

(b) deriving from the master pulse train a quantity of N interleaved pulse trains, staggered in time such that each interleaved pulse train has a repetition rate N times lower than that of the master pulse train;

(c) modulating the carrier signal by each said interleaved pulse train to generate corresponding modulated signals;

(d) amplifying each modulated carrier signal through a nonlinear process to produce a corresponding power output;

(e) combining the power outputs from each of the N amplifiers to produce a combined output signal; and (f) filtering the combined output signal through a bandpass filter to recover an amplified replica of the envelope signal and angle-modulated carrier signals.

24. The signal processing method of claim 23 wherein the converting step comprises the steps of modulating each interleaved pulse train over a first region of envelope dynamic range at a rate of 1/N of a desired rate such that pulses occur at periodic intervals while pulse duration is a function of amplitude of the envelope signal, and inhibiting over a second region of the dynamic range, pulses of one or more of the interleaved pulse trains whereby average output power is reduced in proportion to average duty factor.

25. A method of sending information, originating as an envelope signal and an angle-modulated carrier signal, over an optical transmission link without requiring linear amplitude modulation of an optical signal, the method comprising the steps of:

(a) amplitude modulating the optical signal with a radio frequency signal which has been amplitude limited, and then pulse modulated by a signal whose duty factor is a function of the envelope of the original envelope signal;

(b) transmitting the modulated optical signal, (c) receiving the pulse modulated and transmitted optical signal at the receiver side; and (d) filtering the detected RF signal in a bandpass filter for recovering the original envelope and angle-modulated carrier signals.

26. A method of sending information, originating as an envelope signal and a constant amplitude angle-modulated carrier signal, over an optical transmission link without requiring linear amplitude modulation of an optical signal, the method comprising the steps of:

(a) amplitude modulating the optical signal with the constant amplitude angle/modulated signal;

(b) directly pulse modulating the optical signal with a pulse train whose duty factor is a function of the envelope signal;

(c) detecting the pulse modulated optical signal at the receive side; and (d) bandpass filtering the resulting detected signal to generate a replica of said envelope and angle-modulated signals.

27. An electronic signal processing system for high efficiency power amplification of an envelope signal and an angle-modulated carrier signal, comprising:

a pulse source adapted to provide a train of pulses recurring at a rate at least an order of magnitude greater than a maximum bandwidth of the envelope signal and having a duty factor which is a function of said envelope signal;

a pulse modulator for modulating the carrier signal in accordance with the train of pluses to produce a combined modulated signal independent of amplitude and containing amplitude and phase information of the original envelope and carrier signals;

a nonlinear power amplifier for amplifying the combined modulated signal to produce a combined power signal; and a bandpass filter responsive to the combined power signal to generate a bandpass signal corresponding to the original envelope and carrier signals.

28. The signal processing apparatus of claim 27 wherein the pulse source comprises means for deriving pulses having a time duration proportional to a function of the amplitude of the envelope signal and occurring at constant periodic intervals.

29. The signal processing apparatus of claim 27 wherein the pulse source comprises means for deriving pulses having a constant time duration and occurring at a varying repetition rate which is a function of the amplitude of the envelope signal.

30. The signal processing apparatus of claim 27 wherein the pulse source comprises means for varying said pulses in both duration and rate such that over a first portion of a dynamic range of the envelope signal the pulses are made to occur at periodic intervals and to have a duration which is a function of the amplitude of the envelope signal, and over a second portion of the dynamic range, the pulses are made to have constant duration and are made to vary in pulse rate as a function of amplitude of the envelope signal, such that the resultant pulses vary in duty factor in a predetermined relationship with the amplitude of the envelope signal.

31. The signal processing apparatus of claim 27 wherein the pulse source comprises a look-up table, and means for addressing said look-up table for determining a pulse duty factor in response to an envelope signal amplitude.

32. A signal processing method for non-linearly processing an envelope signal and an angle-modulated carrier signal for effecting a substantially linear transformation of the combined signal, the method comprising the steps of:

(a) deriving, from the envelope signal, a pulse train signal having pulses which occur at a pulse repetition rate and which have a duty factor which is a function of the amplitude of the envelope signal;

(b) modulating the carrier signal by the pulse train signal for providing a pulse modulated carrier signal independent of amplitude, and which contains both angle information of the carrier signal and envelope information of the envelope signal;

(c) processing the pulse modulated carrier signal through a nonlinear process to generate a processed output signal; and (d) bandpass filtering the processed output signal to recover a linearly related replica of the combined signal.

33. A signal processing method of enabling an envelope signal and an angle-modulated carrier signal to be transmitted through a plurality, N of nonlinear power amplifiers operating in parallel, the method comprising the steps of:

(a) converting the envelope signal to a plurality of pulse trains, said converting step comprising the step of interleaving said pulse trains by staggering, in time, by one pulse period each said pulse train, and each pulse having a duty factor which is a function of the amplitude of the envelope signal;
(b) modulating the carrier signal by each said interleaved pulse train to generate corresponding modulated signals;
(c) processing each modulated carrier signal through a substantially nonlinear process to produce a corresponding processed output signal;
(d) combining the processed output signals to produce a combined output signal; and
(e) filtering the combined output signal through a bandpass filter to recover a linear replica of the envelope and angle-modulated signals.

34. The signal processing method of claim 33 wherein the converting step comprises the steps of
controlling the duty factor and pulse duration of each pulse train over a first region of envelope dynamic range rate to have a pulse rate of 1/N of a desired pulse rate for the combined output signal such that pulses occur at periodic intervals while pulse duration is a function of amplitude of the envelope signal,
inhibiting over a second region of the dynamic range, pulses of one or more of the interleaved pulse trains whereby average output power is reduced in proportion to average duty factor, and
increasing pulse duration of each pulse train over a third region of dynamic range to generate overlapping pulses in said pulse trains.

* * * * *